(12) United States Patent
Morita et al.

(10) Patent No.: US 7,919,353 B2
(45) Date of Patent: Apr. 5, 2011

(54) SEMICONDUCTOR DEVICE AND MANUFACTURING METHOD THEREOF

(75) Inventors: Yuichi Morita, Yokosuka (JP); Takashi Noma, Ota (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 83 days.

(21) Appl. No.: 12/440,864

(22) PCT Filed: Aug. 22, 2007

(86) PCT No.: PCT/JP2007/066707
§ 371 (c)(1),
(2), (4) Date: Mar. 11, 2009

(87) PCT Pub. No.: WO2008/032566
PCT Pub. Date: Mar. 20, 2008

(65) Prior Publication Data
US 2010/0038742 A1 Feb. 18, 2010

(30) Foreign Application Priority Data

Sep. 11, 2006 (JP) ................................. 2006-245197

(51) Int. Cl.
*H01L 21/00* (2006.01)
(52) U.S. Cl. ................ 438/106; 257/613; 257/E23.033; 257/E23.021; 257/E23.068
(58) Field of Classification Search .................. 438/106, 438/613; 257/690, 737, E23.033, E23.021, 257/E23.068
See application file for complete search history.

(56) References Cited

U.S. PATENT DOCUMENTS 6,646,289 B1 11/2003 Badehi
(Continued)

FOREIGN PATENT DOCUMENTS

JP 8-204322 8/1996
(Continued)

OTHER PUBLICATIONS

International search report mailed Nov. 27, 2007, directed to counterpart international application PCT/JP2007/066707; (1 page).

*Primary Examiner* — Matthew S Smith
*Assistant Examiner* — Christine Enad
(74) *Attorney, Agent, or Firm* — Morrison & Foerster LLP

(57) ABSTRACT

This invention is directed to offer a technology that makes it possible to form desired bump electrodes easily when the bump electrodes are to be formed at locations lowered by a step. There is formed an isolation layer 12 to isolate each of bump electrode forming regions 11. The isolation layer 12 is a resist layer, for example, and is formed by exposure and development processes, for example. Each of the bump electrode forming regions 11 is surrounded by the isolation layer 12 and a protection layer 10 that covers a side surface of a semiconductor substrate 2. Then, a printing mask 16 that has openings 15 at locations corresponding to the bump electrode forming regions 11 is placed above the semiconductor substrate 2. Next, solder 17 in paste form is applied to the printing mask 16. Then the solder 17 is applied to a metal layer 9 by moving a squeeze 18 at a constant speed. Bump electrodes 19 are obtained by heating, melting and re-crystallizing the solder 17 after removing the printing mask 16.

11 Claims, 12 Drawing Sheets

U.S. PATENT DOCUMENTS

| | | | |
|---|---|---|---|
| 7,633,133 B2 * | 12/2009 | Noma et al. | 257/434 |
| 2004/0094841 A1 * | 5/2004 | Matsuzaki et al. | 257/758 |
| 2004/0113185 A1 * | 6/2004 | Shibayama et al. | 257/292 |
| 2004/0209451 A1 | 10/2004 | Kukimoto et al. | |
| 2007/0210437 A1 * | 9/2007 | Noma et al. | 257/690 |
| 2009/0008798 A1 * | 1/2009 | Yoshida et al. | 257/777 |

FOREIGN PATENT DOCUMENTS

| | | |
|---|---|---|
| JP | 2002-512436 A1 | 4/2002 |
| JP | 2004-314601 | 11/2004 |
| JP | 2004-319676 | 11/2004 |
| JP | 2006-173198 | 6/2006 |
| WO | WO-2008/032566 | 3/2008 |

* cited by examiner

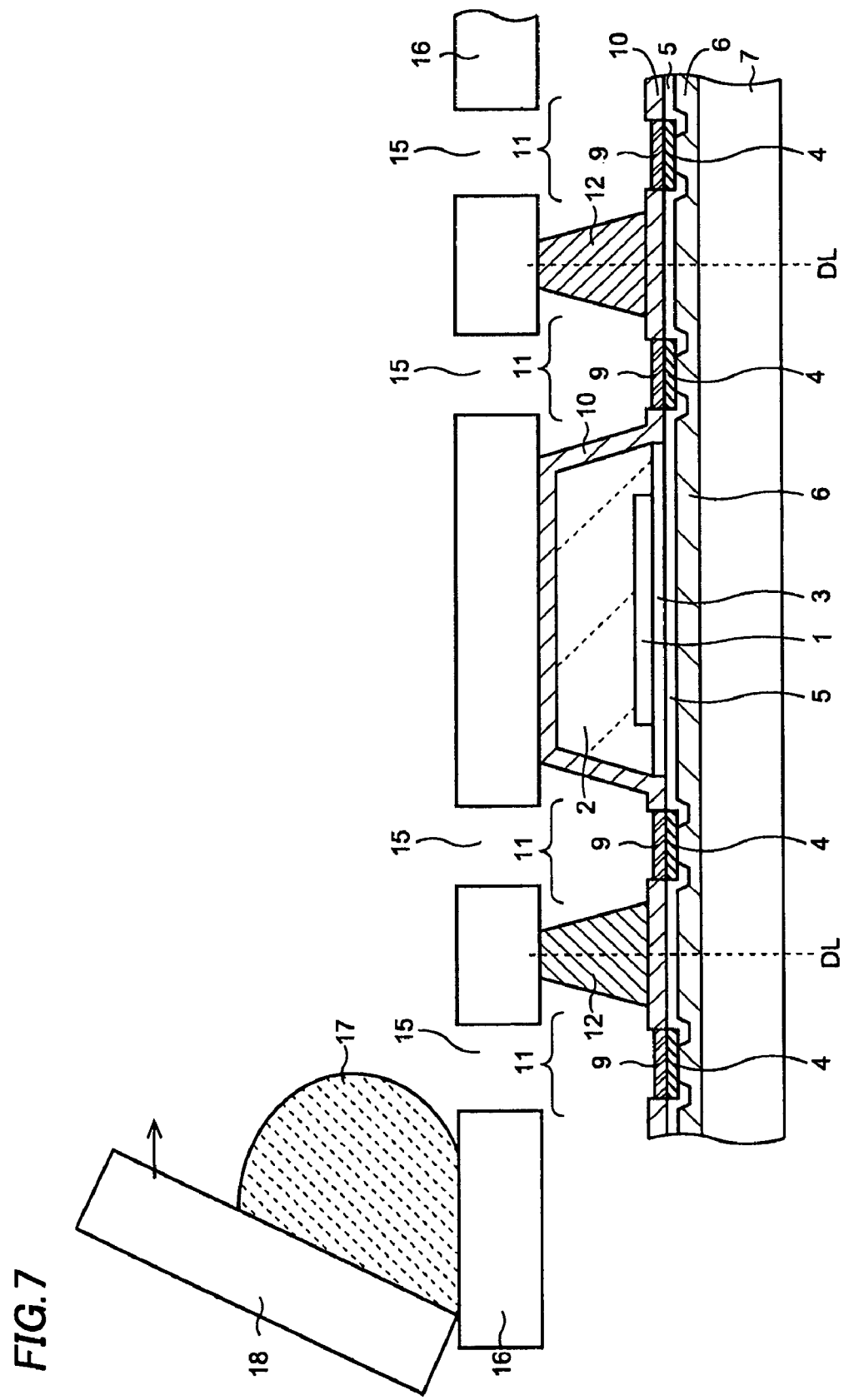

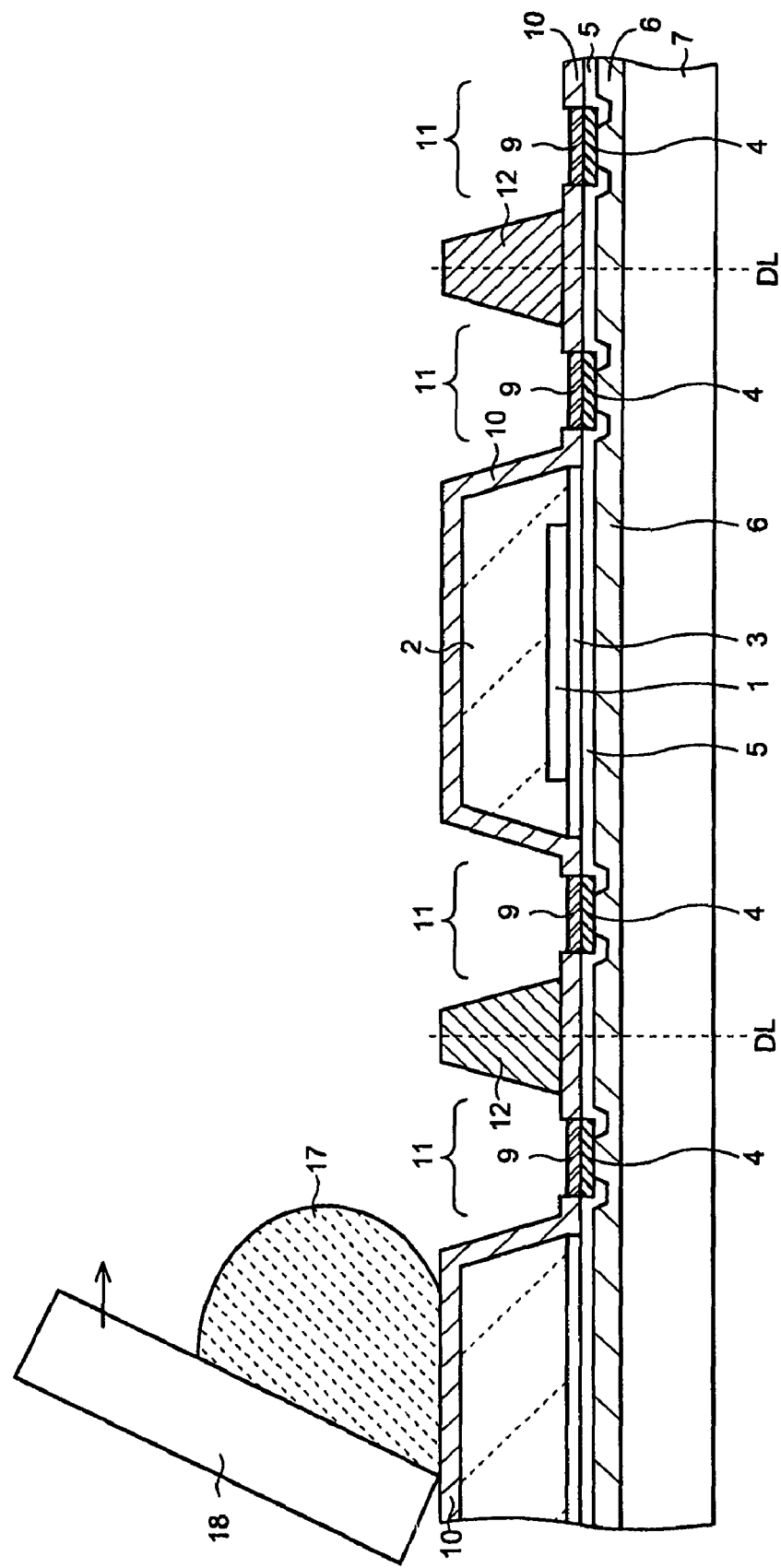

SEMICONDUCTOR DEVICE AND MANUFACTURING METHOD THEREOF

REFERENCE TO RELATED APPLICATIONS

This application is a national stage application under 35 USC 371 of International Application No. PCT/JP2007/066707, filed Aug. 22, 2007, which claims priority from Japanese Patent Application No. 2006-245197, filed Sep. 11, 2006, the contents of which are incorporated herein by reference.

FIELD OF THE INVENTION

This invention relates to a semiconductor device and its manufacturing method, specifically to formation of a bump electrode.

DESCRIPTION OF THE RELATED ART

A CSP (Chip Size Package) has received attention in recent years as a new packaging technology. The CSP means a small package having about the same outside dimensions as those of a semiconductor die packaged in it.

A BGA (Ball Grid Array) type semiconductor device has been known as a kind of CSP. The BGA type semiconductor device is provided with a plurality of ball-shaped bump electrodes that are electrically connected with pad electrodes disposed on a semiconductor substrate.

When the BGA type semiconductor device is mounted on electronic equipment, the semiconductor die is electrically connected with an external circuit mounted on a printed circuit board by bonding each of the bump electrodes to a wiring pattern on the printed circuit board.

Among methods to form the bump electrodes, there are a vapor deposition method, a plating method and a dispense method. However, the vapor deposition method has problems that are a need for a large apparatus, a high manufacturing cost and low productivity. Also, the plating method has problems such as unevenness in compositions, unevenness in heights of the bump electrodes and a high manufacturing cost. Also, the dispense method has a problem of productivity because it takes a lot of time. Therefore, a printing method has drawn attention from the viewpoint of the manufacturing cost and the productivity.

Outline procedural steps of the printing method will be briefly explained referring to the drawings. FIG. 14 and FIG. 15 are cross-sectional views shown in the order of manufacturing steps.

First, there is provided a semiconductor substrate 101 on a top surface of which pad electrodes 100 are formed, as shown in FIG. 14. Next, a printing mask 103 having openings 102 only in regions where the bump electrodes are to be formed, that is, in regions where the pad electrodes 100 are formed, is placed on the semiconductor substrate 101. Next, solder 104 is applied to the printing mask as a material for the bump electrode, and a squeeze 105 made of metal or resin is moved in a direction indicated by an arrow. By moving the squeeze 105, the solder 104 is applied onto the pad electrodes 100 through the openings 102.

Next, the printing mask 103 is removed and the solder 104 is heated, melted and re-crystallized to form the bump electrodes 106 on the pad electrodes 100, as shown in FIG. 15.

The technologies described above are disclosed in Japanese Unexamined Patent Publication No. 2004-314601 and Japanese Examined Patent Publication No. 2002-512436, for example.

SUMMARY OF THE INVENTION

In a structure of a new semiconductor device developed by the inventors, it is required to directly form a bump electrode at a portion that is lowered by a step. In the structure of the semiconductor device, a supporting member 112 (a glass substrate, for example) is bonded to a semiconductor substrate 110, in which a device component (not shown) is formed, through an adhesive layer 111, as shown in FIG. 16. The semiconductor substrate 110 is selectively removed, and pad electrodes 113, that are electrically connected with the device component, are formed along a periphery of the semiconductor substrate 110. Also, there is formed a metal layer 114 (a nickel layer or a gold layer, for example) is formed on a surface of each of the pad electrodes 113 on a side of the semiconductor substrate 110. Also, there is formed an insulative passivation film 115 that covers a top surface side of the semiconductor substrate 110 and at least a portion of another surface of the pad electrode 113. Also, there is formed a protection film 116 that covers a back surface and a side surface of the semiconductor substrate 110 and has openings above the metal layers 114.

When the printing mask 103 is placed on the structure described above, there is caused a step 117, amount of which is approximately a thickness of the semiconductor substrate 110, between the printing mask 103 and the metal layer 114.

If the solder 104 is applied in this state, the solder 104 is not likely to be applied precisely onto the metal layer 114 due to an influence of the step 117. Also, it is difficult to adjust an amount of the solder 104 that is to be applied. As a result, there is caused a problem that unevenness occurs in heights and sizes of the bump electrodes.

Also, in the printing method, the material for the bump electrode has fluidity. Therefore, there is caused a problem that the material makes contact with the material in the neighboring region so that the bump electrodes make contact with each other.

Thus, this invention is directed to offer a technology that makes it possible to form a desired bump electrode easily when the bump electrode is to be formed at the portion that is lowered by the step.

This invention is directed to solving the problems addressed above and has following features. That is, a manufacturing method of a semiconductor device according to this invention is characterized by including providing a semiconductor substrate on a top surface of which a device component is formed, a process step to bond a supporting member onto the top surface of the semiconductor substrate, a process step to expose bump electrode forming regions by selectively removing the semiconductor substrate, a process step to form an isolation layer that surrounds at least a portion of each of the bump electrode forming regions on a side of a side surface and isolates each of the bump electrode forming regions and a process step to form a bump electrode in each of the bump electrode forming regions.

Also, a manufacturing method of a semiconductor device according to this invention is characterized by including providing a semiconductor substrate on a top surface of which a device component is formed, a process step to bond a supporting member onto the top surface of the semiconductor substrate, a process step to expose bump electrode forming regions by selectively removing the supporting member, a process step to form an isolation layer that surrounds at least a portion of each of the bump electrode forming regions on a side of a side surface and isolates each of the bump electrode forming regions and a process step to form a bump electrode in each of the bump electrode forming regions.

Also, a semiconductor device according to this invention is characterized by including a semiconductor substrate on a top surface of which a device component is formed, a pad electrode electrically connected with the device component and formed in a portion lowered by a step, a bump electrode formed on the pad electrode, and an isolation layer that surrounds at least a portion of a side surface of the bump electrode and isolates each of the bump electrodes.

According to this invention, there is formed the isolation layer that surrounds at least the portion of each of the bump electrode forming regions and isolates each of the bump electrode forming regions. Therefore, even when the bump electrodes are to be formed at the portions lowered by the steps, the material for the bump electrode is suppressed from flowing and the bump electrodes are prevented from making contact with each other by the isolation layer that serves as a barrier. Also, forming the bump electrodes without using the printing mask is made possible by the formation of the isolation layer. As a result, it is made possible to form desired bump electrodes easily and efficiently while the manufacturing cost is suppressed.

BRIEF DESCRIPTION OF THE DRAWINGS

FIG. 7 is a cross-sectional view explaining the semiconductor and its manufacturing method according to the first embodiment of this invention.

FIG. 8 is a cross-sectional view explaining the semiconductor device and its manufacturing method according to the first embodiment of this invention.

DETAILED DESCRIPTION OF THE INVENTION

Figure 1:
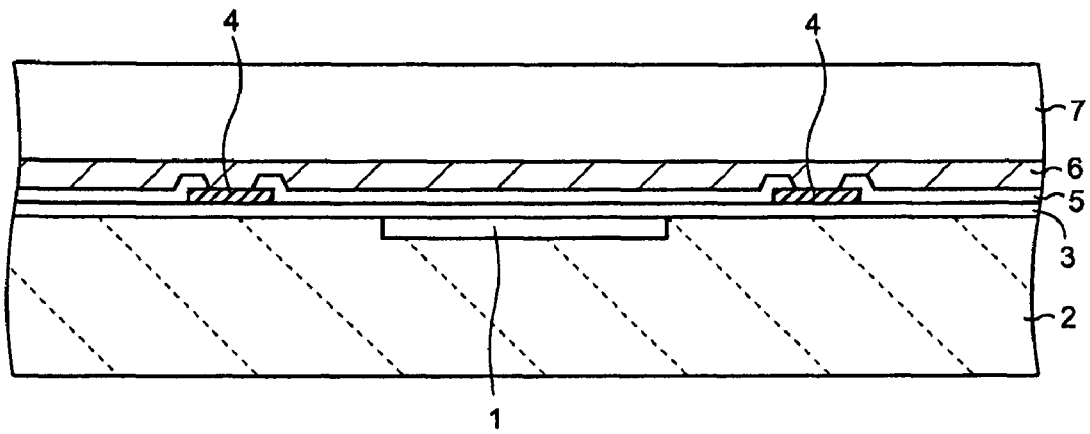
FIG. 1 is a cross-sectional view explaining a semiconductor device and its manufacturing method according to a first embodiment of this invention.

A semiconductor device according to a first embodiment of this invention will be explained hereafter referring to the drawings. FIGS. 1 through 9 are cross-sectional views and plan views presented in the order of manufacturing process steps.

First, as shown in FIG. 1, there is provided a semiconductor substrate 2, made of silicon (Si) or the like, on a top surface of which a device component 1 (a light-receiving component such as a CCD, a CMOS sensor or an infrared sensor, a light-emitting component or other semiconductor component, for example) is formed. The semiconductor substrate 2 is about 300-700 μm thick, for example. A first insulation film 3 (a silicon oxide film formed by a thermal oxidation method or a CVD method, for example) of a thickness of 2 μm, for example, is formed on the top surface of the semiconductor substrate 2.

Next, a metal layer made of aluminum (Al), aluminum alloy or copper (Cu), for example, is formed by a sputtering method, a plating method or other film forming method, and thereafter the metal layer is etched using a resist layer (not shown) as a mask to form pad electrodes 4 of a thickness of 1 μm, for example, on the first insulation film 3. The pad electrodes 4 make electrodes for external connections, which are electrically connected with the device component 1 and its peripheral component through interconnections (not shown). Although the pad electrodes 4 are disposed on both sides of the device component 1 in FIG. 1, their locations are not limited and they may be disposed above the device component 1.

Next, a passivation film 5 (a silicon nitride film formed by the CVD method, for example) that covers all or a portion of the pad electrode 4 is formed over the top surface of the semiconductor substrate 2. The passivation film 5 shown in FIG. 1 is formed so as to cover a portion of the pad electrode 4.

Next, a supporting member 7 is bonded to the top surface of the semiconductor substrate 2 including the pad electrodes 4 through an adhesive layer 6 made of epoxy resin, polyimide (photosensitive polyimide, for example), resist, acryl or the like.

The supporting member 7 may be a film-shaped protection tape, may be a rigid substrate made of glass, quartz, ceramics, metal or the like, or may be made of resin. It is preferable that the supporting member 7 is a rigid substrate for the purpose of firmly supporting the semiconductor substrate 2 that is to be reduced in thickness and accommodating hands-free automatic transfer. The supporting member 7 has a function of supporting the semiconductor substrate 2 as well as protecting a surface of the component. When the device component 1 is a light-receiving component or a light-emitting component, the supporting member 7 is to be made of a transparent or semitransparent material to permit light to pass through.

Next, back grinding using a back surface grinding apparatus (a grinder) is applied to a back surface of the semiconductor substrate 2 to reduce the thickness of the semiconductor substrate 2 to a predetermined thickness (about 50-200 μm, for example). The back grinding may be replaced with etching, or with a combination of grinding and etching. The back grinding is not required in some cases, depending on usage or specifications of the finished product or an initial thickness of the semiconductor substrate 2 being provided.

Figure 2:
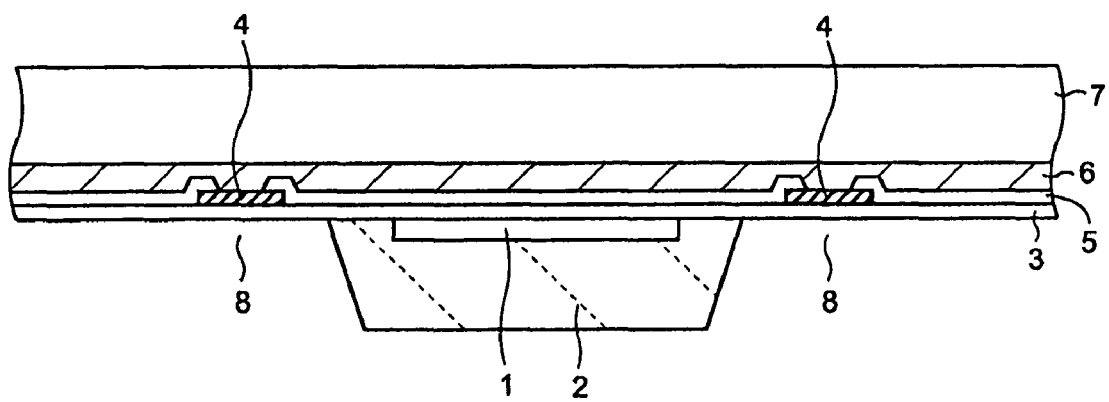
FIG. 2 is a cross-sectional view explaining the semiconductor device and its manufacturing method according to the first embodiment of this invention.

Next, predetermined regions of the semiconductor substrate 2 corresponding to the pad electrodes 4 are selectively etched off from a side of the back surface of the semiconductor substrate 2 to expose portions of the first insulation film 3, as shown in FIG. 2. The exposed portions are hereafter referred to as openings 8.

Figure 3A:
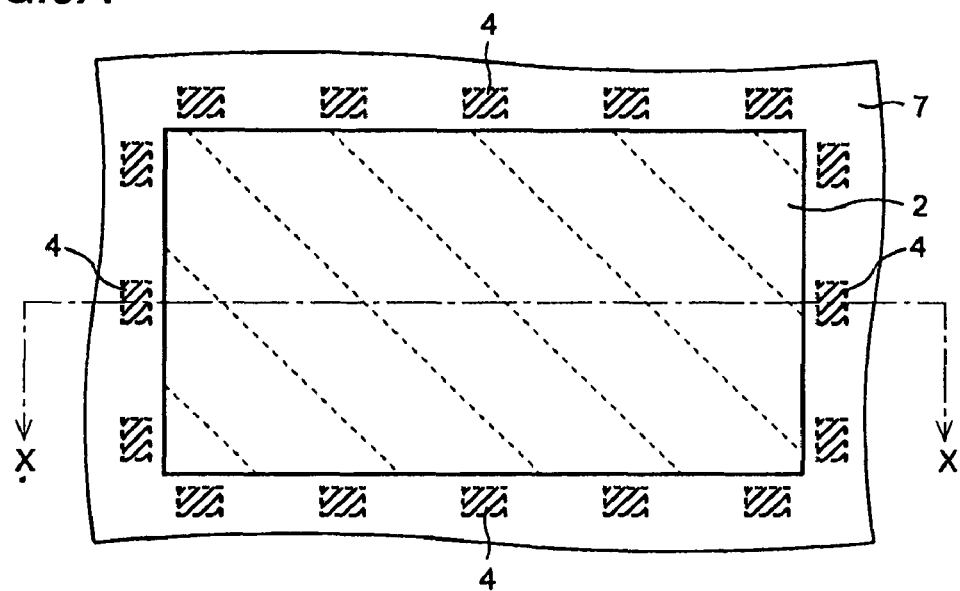
FIGS. 3A and 3B are plan views explaining the semiconductor device and its manufacturing method according to the first embodiment of this invention.
Figure 3B:
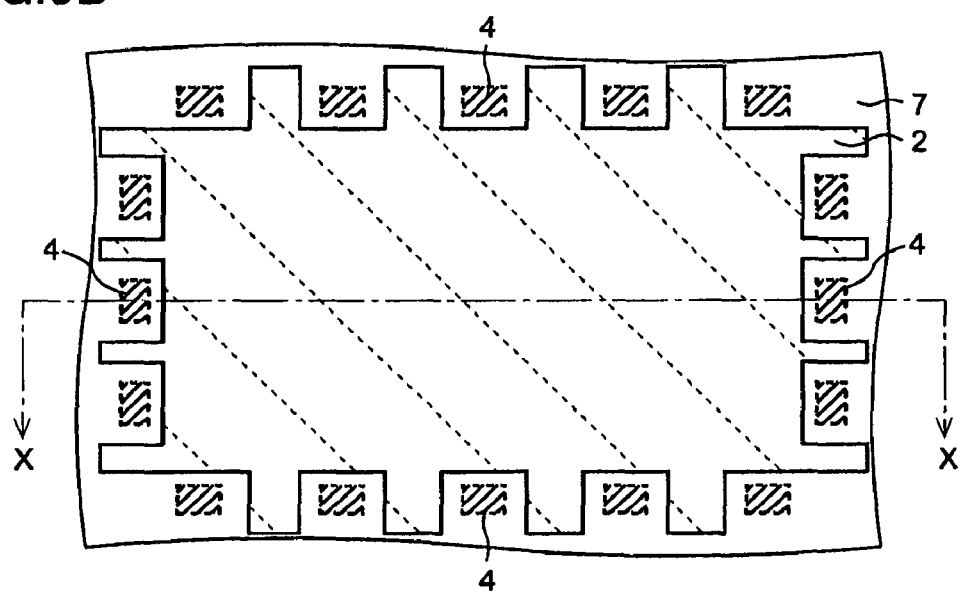

The selective etching of the semiconductor substrate 2 will be explained referring to FIGS. 3A and 3B. FIGS. 3A and 3B are brief plan views looked from below (from a side of the semiconductor substrate 2). FIG. 2 corresponds to a cross-sectional view of a section X-X in FIGS. 3A and 3B.

The semiconductor substrate 2 may be etched to a shape which is roughly a rectangle that is narrower in width than the supporting member 7, as shown in FIG. 3A. Or, the semiconductor substrate 2 may be shaped to have a rugged periphery by etching off the semiconductor substrate 2 only from regions in which the pad electrodes 4 are formed, as shown in FIG. 3B. The latter has larger overlapping area between the semiconductor substrate 2 and the supporting member 7, and leaves the semiconductor substrate 2 extended closer to a periphery of the supporting member 7. Therefore, a structure of the latter is more preferable in terms of enhancing the strength of the supporting member 7 to bolster the semiconductor substrate 2. Also, cracks and separation in the semiconductor device can be prevented since warping of the supporting member 7 due to a difference in a coefficient of thermal expansion between the semiconductor substrate 2 and the supporting member 7 can be prevented with the latter structure. It is also possible to design the semiconductor substrate 2 in a shape different from either of the planar shapes shown in FIGS. 3A and 3B.

Although the semiconductor substrate 2 is etched in a way that sidewalls of the semiconductor substrate 2 are tapered so that a width of the semiconductor substrate 2 is increased toward the top surface in this embodiment, the semiconductor substrate 2 may also be etched in a way that the sidewalls of the semiconductor substrate 2 are perpendicular to a principal surface of the supporting member 7 to keep the width of the semiconductor substrate 2 constant.

Figure 4:
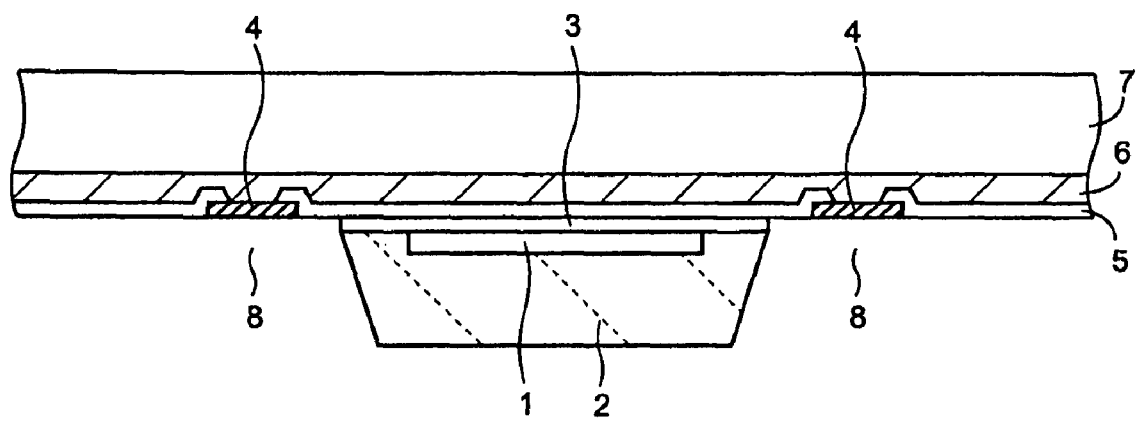
FIG. 4 is a cross-sectional view explaining the semiconductor device and its manufacturing method according to the first embodiment of this invention.

Next, the first insulation film 3 is selectively etched using the semiconductor substrate 2 as a mask, as shown in FIG. 4. The first insulation film 3 in a region between an edge of the semiconductor substrate 2 and a predetermined dicing line is removed by the etching to expose a surface (a surface on the side of the semiconductor substrate 2) of the pad electrode 4 at a bottom of the opening 8. It is also possible that a resist layer is formed to be used as the mask in the etching.

Figure 5:
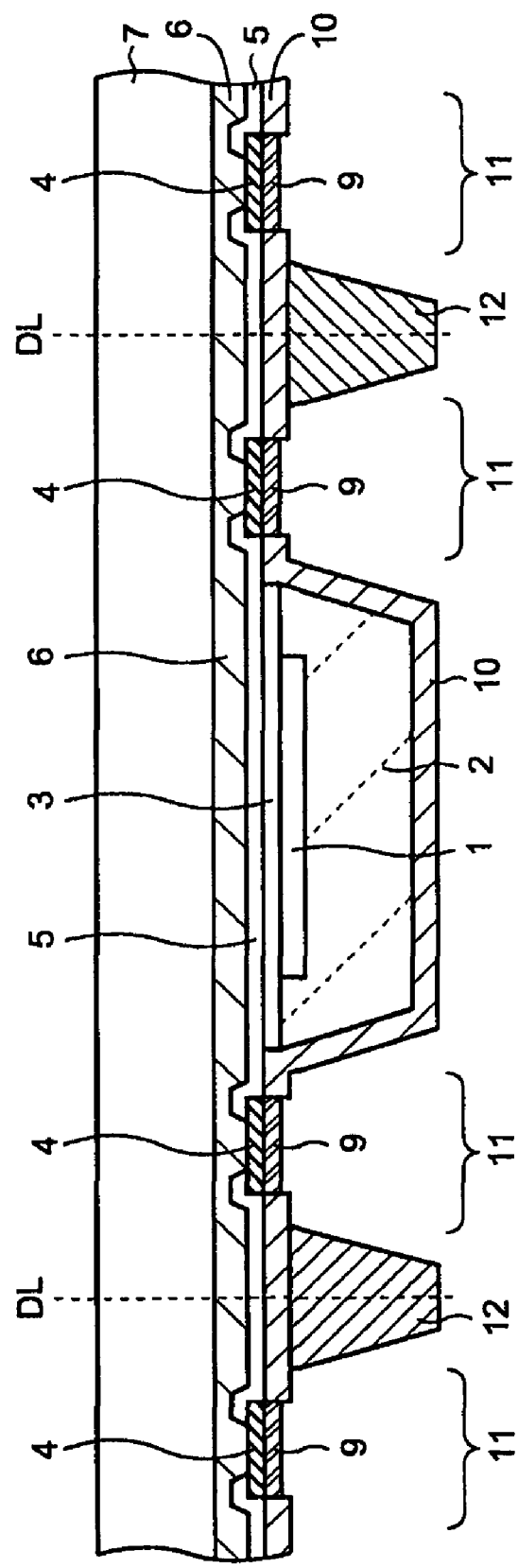
FIG. 5 is a cross-sectional view explaining the semiconductor device and its manufacturing method according to the first embodiment of this invention.

Next, a metal layer 9 is formed on the exposed surface of the pad electrode 4, as shown in FIG. 5. The metal layer 9 is made of stacked layers of a nickel (Ni) layer and a gold (Au) layer, for example, and can be formed by a lift-off method, which means sputtering these metals sequentially using a resist layer as a mask and thereafter removing the resist layer, or by a plating method.

The materials to form the metal layer 9 may be varied as appropriate. That is, the metal layer 9 may be made of a titanium (Ti) layer, a tungsten (W) layer, a copper (Cu) layer, a tin (Sn) layer or the like, other than the nickel layer and the gold layer. The materials for the metal layer 9 are not limited specifically, and may be any materials as long as the materials have functions to electrically connect between the pad electrode 4 and the bump electrode 19, that is to be described, and to protect the pad electrode 4, and the metal layer 9 may be made of a single layer or stacked layers of the materials. Examples of the stacked layers are a nickel layer/a gold layer, a titanium layer/a nickel layer/a copper layer, a titanium layer/a nickel-vanadium layer/a copper layer, and the like.

Next, there is formed a protection layer 10 of a thickness of 10 μm, for example, having openings at locations corresponding to the pad electrode 4 and the metal layer 9. The opening is formed on a principal surface of the pad electrode 4 on the side of the semiconductor substrate 2.

The protection layer 10 is formed as described below, for example. First, an organic material such as polyimide resin, solder resist or the like is applied over the entire surface by an application-coating method and a thermal treatment (pre-bake) is performed. Then, the applied organic material is exposed to light and developed to form the openings that expose a surface of the metal layer 9. After that, a thermal treatment (post-bake) is performed to obtain the protection layer 10 having the openings at the locations corresponding to the pad electrode 4 and the metal layer 9.

Next, there is formed an isolation layer 12 to isolate each of bump electrode forming regions 11. The isolation layer 12 is a resist layer or an epoxy resin layer, for example, having about the same height as the semiconductor substrate 2, and is formed by applying the material, followed by exposure and development, and further performing a thermal treatment. Although there is no restriction on the material for the isolation layer 12, it is preferably made of photosensitive resin from a standpoint of feasibility of the exposure and development. It may be made of the same material as the protection layer 10. The method to form the isolation layer 12 is not limited to the exposure and development as described above. For example, there may be used a so-called dispense method in which the material for the isolation layer 12 is directly applied along a region to form the isolation layer 12.

Each of the bump electrode forming regions 11 is surrounded by the isolation layer 12 and the protection layer 10 that covers the side surface of the semiconductor substrate 2. That is, the isolation layer 12 surrounds at least a portion of the bump electrode forming region 11 on the side of the side surface. Design (height, width, cross-sectional shape, planar shape and the like) of the isolation layer 12 is not limited as long as it can isolate each of the bump electrode forming regions 11. For example, although a sidewall of the isolation layer 12 is formed to be slanted so that the width of the isolation layer 12 increases toward the supporting member 7 in FIG. 5, it may be formed perpendicular to a principal surface of the supporting member 7 so that the width remains constant.

Figure 6A:
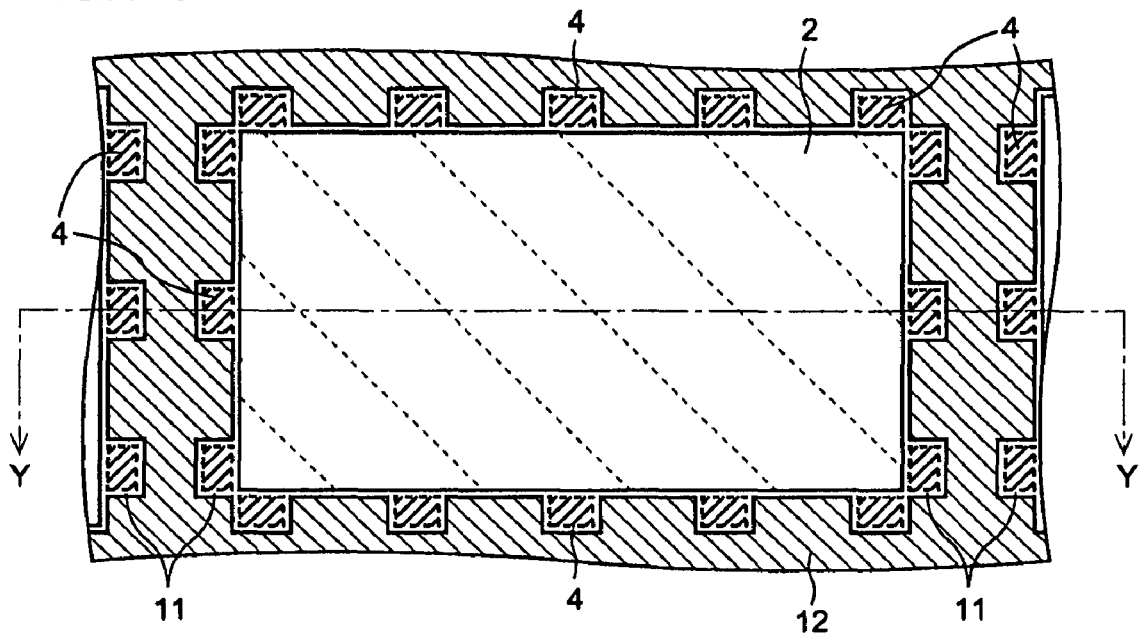
FIGS. 6A and 6B are plan views explaining the semiconductor device and its manufacturing method according to the first embodiment of this invention.
Figure 6B:
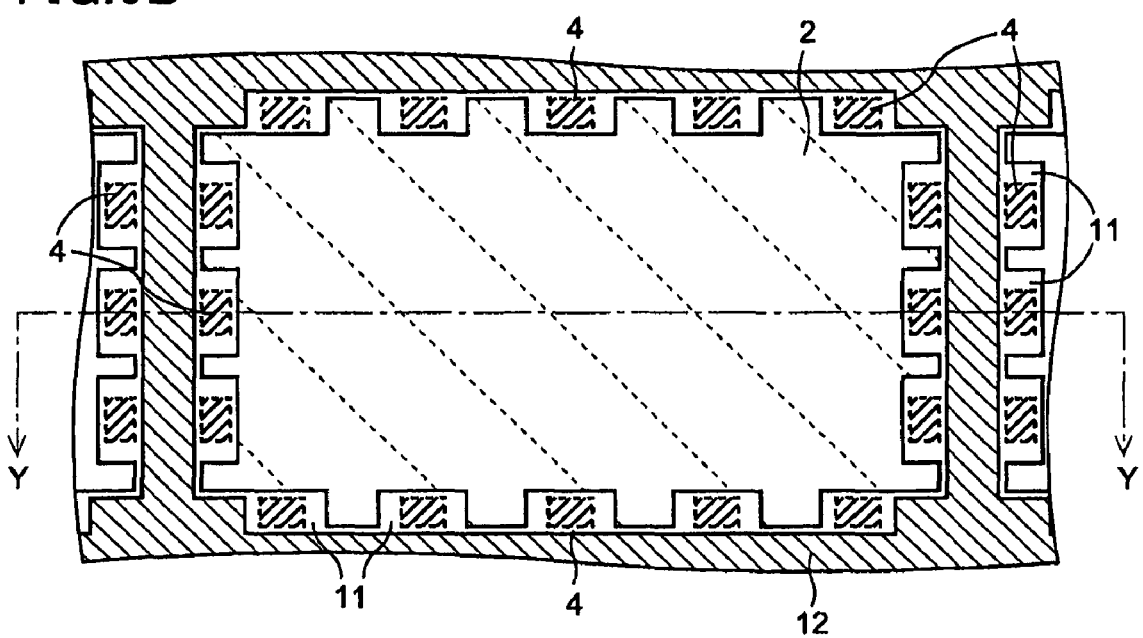

Also, it is possible to modify the planar shape of the isolation layer 12 in accordance with the planar shape of the semiconductor substrate 2 or locations of the bump electrode forming regions 11, as shown in FIGS. 6A and 6B. Also, in FIGS. 6A and 6B, the isolation layer 12 is contiguously formed in contrast to the bump electrode forming regions 11. However, the design of the isolation layer 12 is not limited as described above, and it is possible that individual isolation layer 12 corresponds to each of the bump electrode forming regions 11, for example. FIG. 5 corresponds to a cross-sectional view of a section Y-Y in FIGS. 6A and 6B, in which the metal layer 9 and the protection layer 10 are omitted from showing. The isolation layer 12 may be formed before the forming of the protection layer 10.

It is preferable that all the bump electrode forming regions 11 surrounded by the semiconductor substrate 2 and the isolation layer 12 are equivalent in three-dimensional shape and in volume. The reason is that variation in size and height of the finally formed bump electrodes can be suppressed, since the material for the bump electrode is later applied to each of the bump electrode forming regions 11.

Next, a printing mask 16 that has openings 15 at locations corresponding to the bump electrode forming regions 11 is placed above the semiconductor substrate 2, as shown in FIG. 7. The printing mask 16 is made of metal such as stainless steel or the like, and is 50-200 μm thick. The opening 15 may be in a rectangular shape or in a circular shape, and is not limited to be in a particular shape.

Next, solder 17 in paste form, for example, is applied onto the printing mask 16 as a material for the bump electrode. And a squeeze 18 made of metal or resin is touched to an upper surface of the printing mask 16, and is moved at a constant speed in a direction indicated by an arrow. The solder 17 is buried into the openings 15 by the squeeze 18, and subsequently applied onto the metal layers 9. Attention is paid so that a uniform amount of solder 17 is buried into each of the openings 15. Next, the printing mask 16 is removed.

Although the printing mask 16 is used in FIG. 7, it is also possible to apply the material for the bump electrode without using the printing mask 16, since each of the bump electrode forming regions is already isolated by the isolation layer 12 in this embodiment. For example, the solder 17 is applied to a top surface of the protection layer 10 and the solder 17 is directly applied to each of the bump electrode forming regions 11 by touching the squeeze 18 to an uppermost layer (the protection layer 10 and the isolation layer 12 in this embodiment) and moving it in the direction indicated by the arrow, as shown in FIG. 8. Because the printing mask is not used in this case, the productivity is improved while the manufacturing cost is suppressed. Using the printing mask 16 is preferable from the standpoint of adjusting the amount of the applied material properly.

It is also possible to apply the solder 17 by the so-called dispense method in which a conductive material is directly applied to each of the bump electrode forming regions 11 without using the printing mask 16 or the squeeze 18. By using the dispense method, the solder 17 is applied accurately.

Figure 9:
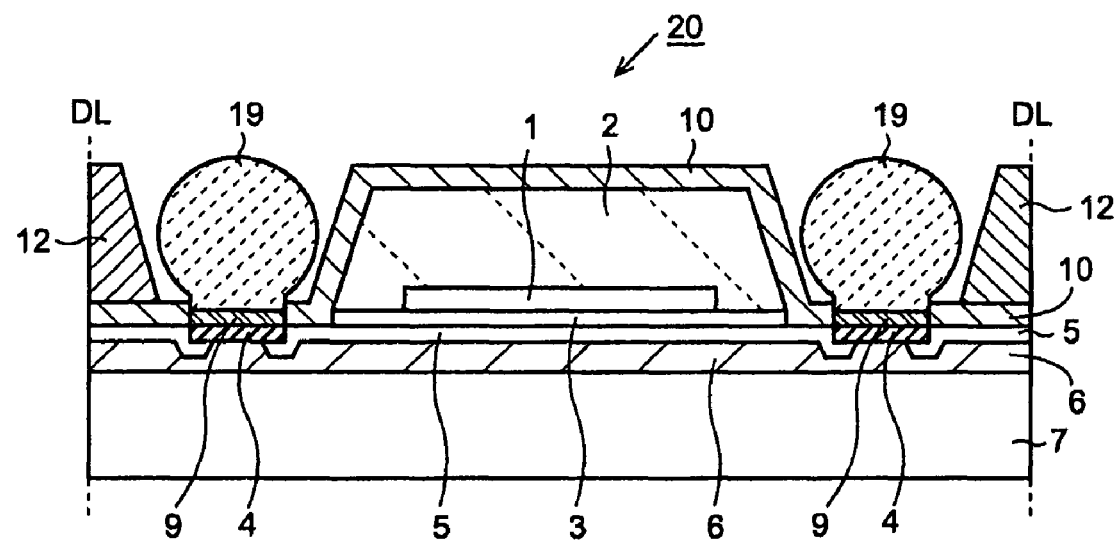
FIG. 9 is a cross-sectional view explaining the semiconductor device and its manufacturing method according to the first embodiment of this invention.

Next, the bump electrodes 19 as shown in FIG. 9 are formed on the metal layer 9 through a process (a reflow process) in which the applied solder 17 is melted by heating and then re-crystallized. In this embodiment, the bump electrodes 19 correspond to the locations of the pad electrode 4 and the metal layer 9, and are formed along the periphery of the supporting member 7.

Next, individual semiconductor devices 20 are separated by cutting along the predetermined dicing lines DL. The method to separate into the individual semiconductor devices 20 may be a dicing method, an etching method, a laser cutting method or the like. In this embodiment, the dicing lines DL are set at locations where the isolation layer 12 is formed.

The supporting member 7 may be left bonded to the semiconductor substrate 2, or the supporting member 7 may be separated before or after the dicing process step.

The completed semiconductor device 20 is mounted on another device on which external electrodes are formed in a pattern.

In this structure, because the isolation layer 12 is formed to surround each of the electrode forming regions, the supplied material for the bump electrode is suppressed from flowing out to other regions. As a result, contact between the bump electrodes can be prevented. Also, forming the bump electrodes without using the printing mask is made possible by the formation of the isolation layer 12. As a result, it is made possible to form desired bump electrodes easily while the manufacturing cost is suppressed. Also, the productivity is high because a large number of bump electrodes can be formed at the same time.

The bump electrode 19 is surrounded by the isolation layer 12 and the semiconductor substrate 2 on which the protection layer 10 is formed. That is, the bump electrode 19 is exposed to the back surface-side (the side on which the bump electrode 19 is formed) of the semiconductor device 20, but not exposed to the side surface-side. As a result, an infiltration of a corrosive material, a mechanical damage (load at assembly, for example) and the like are reduced.

Next, a second embodiment of this invention will be explained referring to the drawings. The same structures as those already explained are denoted by the same symbols and explanations on them are omitted or simplified. FIGS. 10 through 13 are cross-sectional views showing the semiconductor device according the second embodiment of this invention in the order of manufacturing process steps.

The semiconductor substrate 2 is selectively removed in the first embodiment. In the second embodiment, on the other hand, the supporting member 7 is selectively removed.

Figure 10:
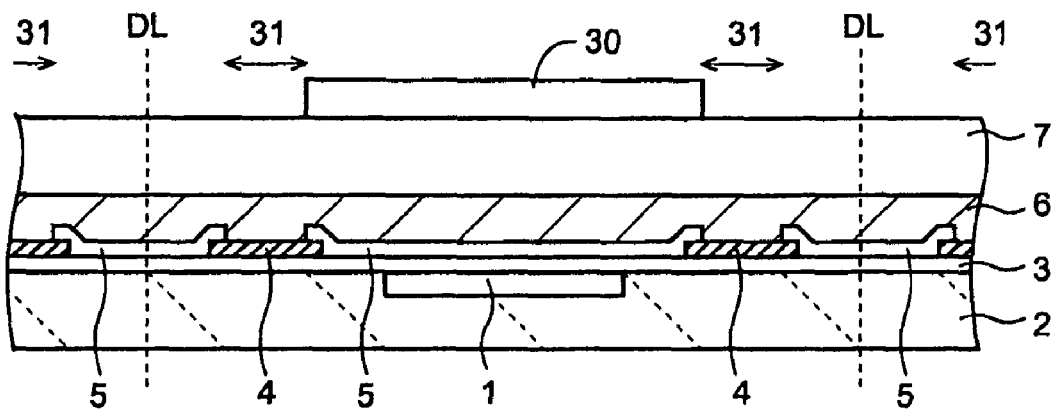
FIG. 10 is a cross-sectional view explaining a semiconductor device and its manufacturing method according to a second embodiment of this invention.

First, there is provided the semiconductor substrate 2 on the top surface of which the device component 1 is formed, and the first insulation film 3, the pad electrodes 4 and the passivation film 5 are formed by the manufacturing process steps that have been already explained, as shown in FIG. 10. Next, the supporting member 7 is bonded to the top surface of the semiconductor substrate 2 including the pad electrodes 4 through the adhesive layer 6. Next, the back grinding is performed to reduce the thickness of the semiconductor substrate 2 to the predetermined thickness, when necessary. The process steps described above are similar to those explained in the first embodiment.

Next, a photoresist layer 30 is selectively formed on a surface of the supporting member 7, as shown in FIG. 10. The photoresist layer 30 is formed to have openings, each of which is in a region corresponding to two bump electrode forming regions 31 facing each other across the dicing line DL and a region between them.

Figure 11:
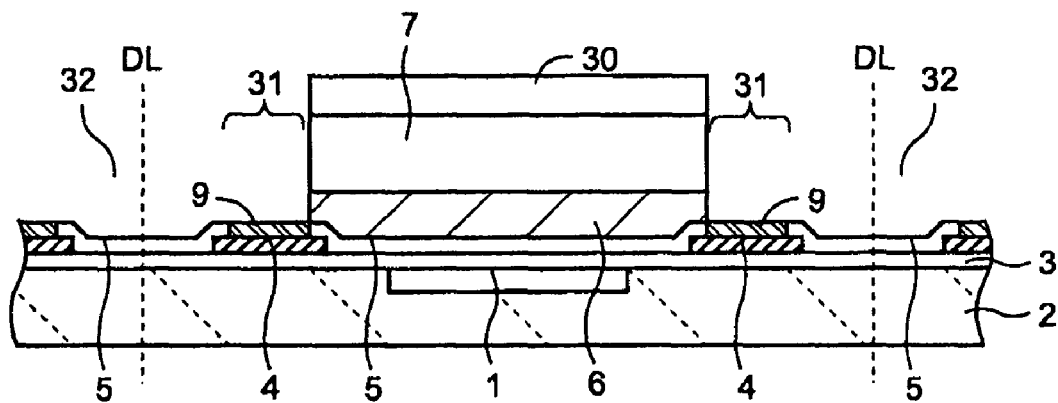
FIG. 11 is a cross-sectional view explaining the semiconductor device and its manufacturing method according to the second embodiment of this invention.

Next, the supporting member 7 is selectively etched using the photoresist layer 30 as a mask, as shown in FIG. 11. This etching removes the two conductive terminal forming regions 31 facing each other across the dicing line DL and the contiguous region between them as a unit, and forms an opening 32 penetrating through the supporting member 7. The selective etching can be implemented by dry etching or by dip etching using hydrofluoric acid (HF) as an etching solution, for example.

Next, a portion of the pad electrode 4 is exposed by selectively etching the adhesive layer 6 exposed at a bottom of the opening 32. The etching of the supporting member 7 and the etching of the adhesive layer 6 may be performed in a single etching process step. Next, the metal layer 9 is formed on the pad electrode 4 exposed at the bottom of the opening 32.

Figure 12:
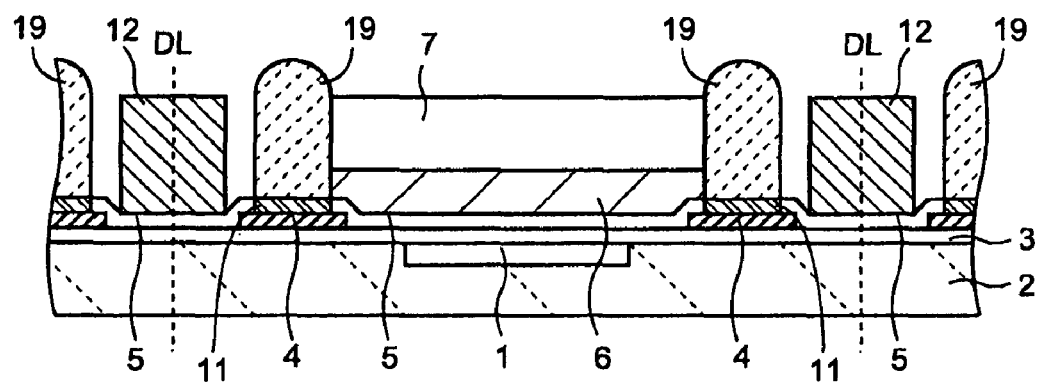
FIG. 12 is a cross-sectional view explaining the semiconductor device and its manufacturing method according to the second embodiment of this invention.

Next, the isolation layer 12 to isolate the bump electrode forming regions 31 from each other is formed as shown in FIG. 12 by a method similar to the method used in the first embodiment. In this embodiment, the isolation layer 12 is formed on the passivation film 5 between the two bump electrode forming regions.

By forming the isolation layer 12, each of the bump electrode forming regions 31 is surrounded by a side surface of the supporting member 7 and the isolation layer 12. The rest of the process steps are similar to those in the first embodiment. That is, the material for the bump electrode is applied using both the printing mask and the squeeze or the material for the bump electrode is applied without using the printing mask. Or the material for the bump electrode is applied using the dispense method. The bump electrode 19 as shown in FIG. 12 is formed on the metal layer 9 by subsequent heating, melting and re-crystallizing. The bump electrodes 19 correspond to the locations of the pad electrode 4 and the metal layer 9, and are formed along the periphery of the supporting member 7.

Figure 13:
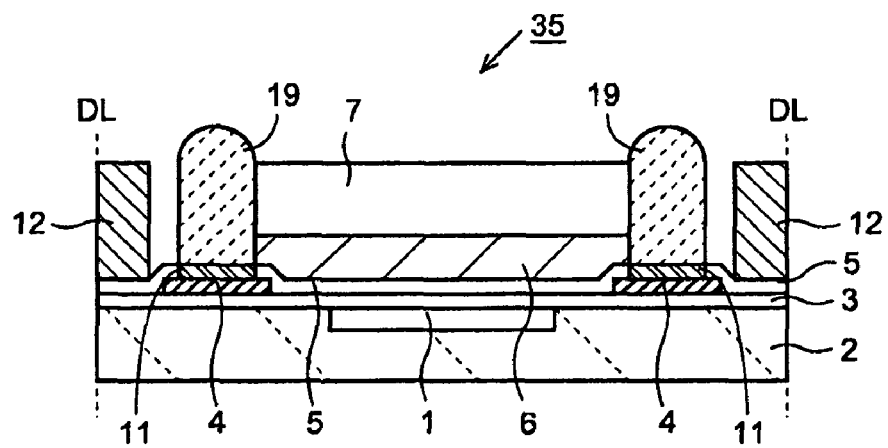
FIG. 13 is a cross-sectional view explaining the semiconductor device and its manufacturing method according to the second embodiment of this invention.
Figure 14:
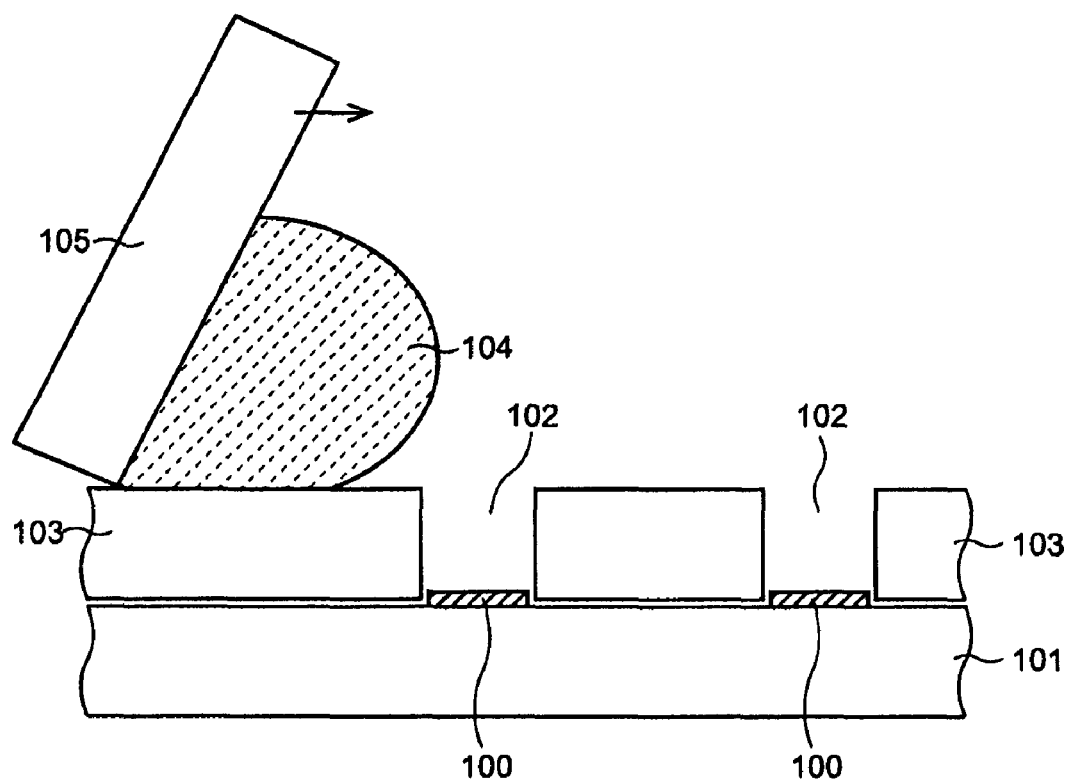
FIG. 14 is a cross-sectional view explaining a manufacturing method of a conventional semiconductor device.
Figure 15:
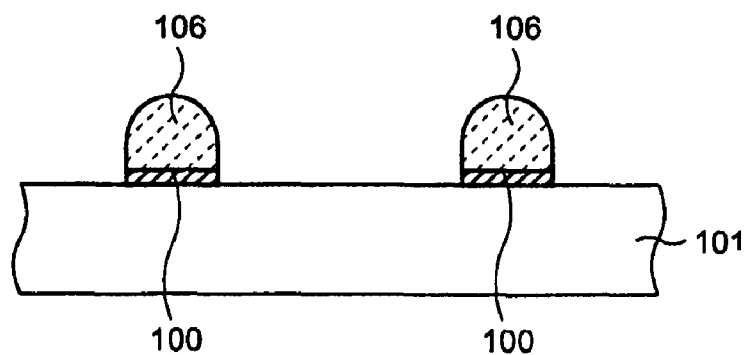
FIG. 15 is a cross-sectional view explaining the manufacturing method of the conventional semiconductor device.
Figure 16:
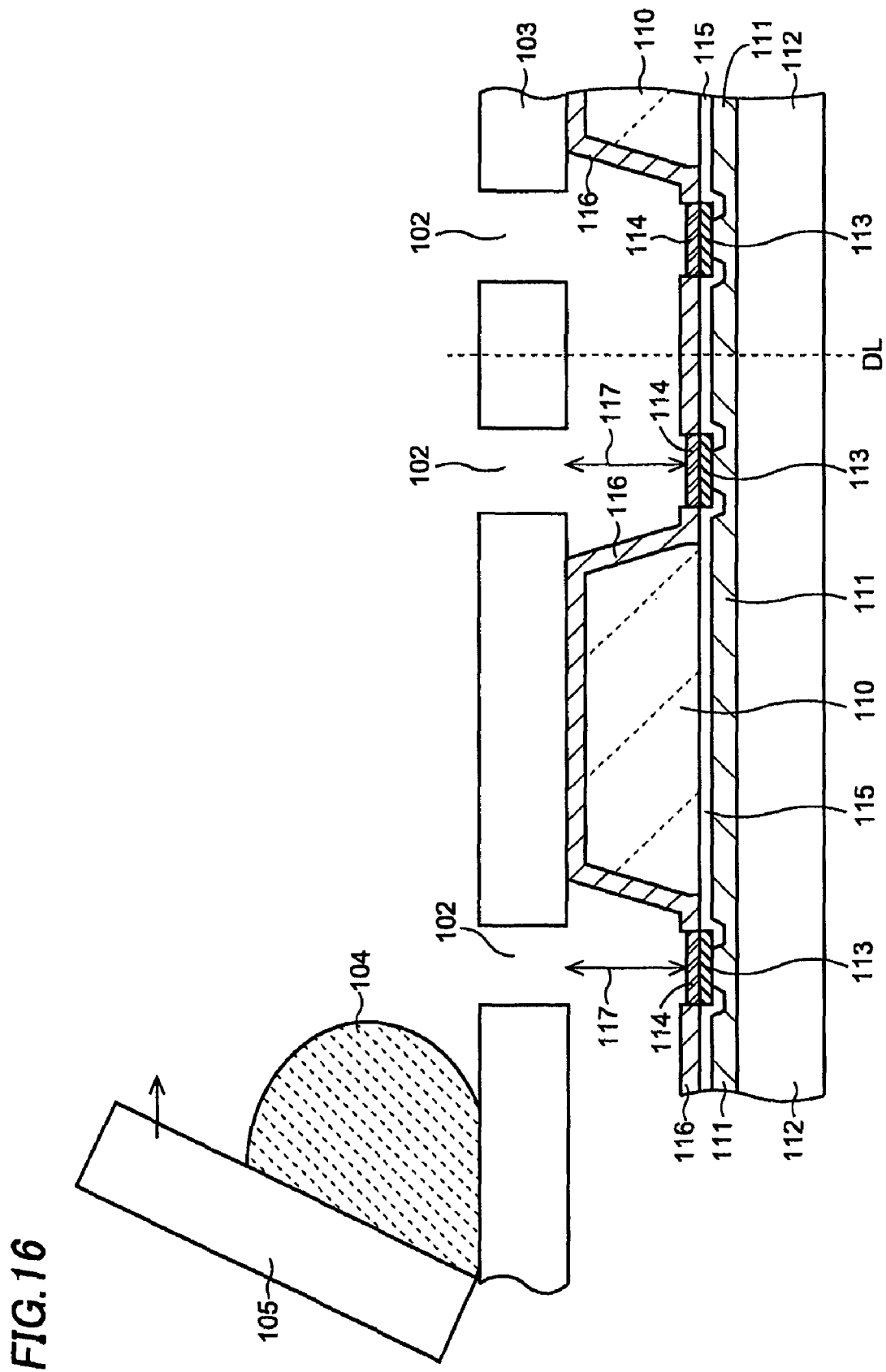
FIG. 16 is a cross-sectional view explaining issues to be solved by the invention.

Next, an individual semiconductor device 35 as shown in FIG. 13 is separated by cutting along the dicing lines DL.

Since the isolation layer 12 is formed in both the first and second embodiments as described above, the supplied material for the bump electrode is suppressed from flowing out to other regions. Therefore, the contact between the bump electrodes can be prevented and the reliability of the semiconductor device is improved as a result. Also, forming the bump electrodes without using the printing mask is made possible by the formation of the isolation layer 12. As a result, it is made possible to form desired bump electrodes easily and efficiently while the manufacturing cost is suppressed.

Needless to say, this invention is not limited to the embodiments described above and may be modified within the scope of the invention. For example, the locations of the dicing lines DL may be modified depending on the location of the isolation layer 12 and a target structure of the semiconductor device. Therefore, the dicing lines DL can be set in regions not overlapping with the isolation layer 12 so that the isolation layer 12 is not left in the structure of the semiconductor device after the dicing. Not leaving the isolation layer 12 in the structure of the semiconductor device is also made possible by adding a process step to remove the isolation layer 12 after the formation of the bump electrodes, which is different from the dicing process step.

Also, when a wiring layer (an aluminum layer formed by a sputtering method, for example) is formed on the back surface of the semiconductor substrate 2 shown in FIG. 7, the bump electrode can be formed on the back surface of the semiconductor substrate 2 by providing an additional opening in the printing mask 16 at a location corresponding to the wiring layer. It is made possible with the method described above that desired bump electrodes are formed together in both regions that are different in height from each other. As described above, this invention can be widely applied to the formation of the various bump electrodes.

The invention claimed is:

1. A method of manufacturing a semiconductor device, comprising:
    providing a semiconductor substrate comprising a device component formed on a top surface of the semiconductor substrate;
    bonding a supporting member to the top surface of the semiconductor substrate;
    removing part of the semiconductor substrate to form a dent so as to expose bump electrode forming regions;
    forming an isolation layer in the dent so that each of the bump electrode forming regions is surrounded in plan view of the semiconductor device by a side surface of the dent and the isolation layer, the isolation layer being foamed away from the side surface of the dent so as to leave space for the bump electrode forming regions between the isolation layer and the side surface of the dent; and
    forming a bump electrode in each of the bump electrode forming regions.

2. The method of claim 1, wherein the isolation layer comprises a resin, and the forming of the isolation layer comprises patterning of a layer made of the resin by photolithography or dispensing of a layer made of the resin.

3. The method of claim 1, wherein the forming of the bump electrode comprises using a printing mask that has openings corresponding to the bump electrode forming regions.

4. The method of claim 1, wherein the forming of the bump electrode comprises applying a conductive material to the bump electrode forming regions and moving a squeegee without using a printing mask.

5. The method of claim 1, wherein the forming of the bump electrode comprises applying a conductive material to the bump electrode forming regions by a dispense method.

6. A method of manufacturing a semiconductor device, comprising:
    providing a semiconductor substrate comprising a device component formed on a top surface of the semiconductor substrate;
    bonding a supporting member to the top surface of the semiconductor substrate;
    removing part of the supporting member to form a dent so as to expose bump electrode forming regions;
    forming an isolation layer in the dent so that each of the bump electrode forming regions is surrounded in plan view of the semiconductor device by a side surface of the dent and the isolation layer, the isolation layer being formed away from the side surface of the dent so as to leave space for the bump electrode forming regions between the isolation layer and the side surface of the dent; and
    forming a bump electrode in each of the bump electrode forming regions.

7. The method of claim 6, wherein the isolation layer comprises a resin, and the forming of the isolation layer comprises patterning of a layer made of the resin by photolithography or dispensing of a layer made of the resin.

8. The method of claim 6, wherein the forming of the bump electrode comprises using a printing mask that has openings corresponding to the bump electrode forming regions.

9. The method of claim 6, wherein the forming of the bump electrode comprises applying a conductive material to the bump electrode forming regions and moving a squeegee without using a printing mask.

10. The method of claim 6, wherein the forming of the bump electrode comprises applying a conductive material to the bump electrode forming regions by a dispense method.

11. A semiconductor device comprising:
    a semiconductor substrate comprising a device component formed on a top surface of the semiconductor substrate;
    a pad electrode electrically connected to the device component and disposed at a bottom of a dent portion;
    a bump electrode formed on the pad electrode; and
    an isolation layer disposed in the dent portion so that the bump electrode is surrounded in plan view of the semiconductor device by a side surface of the dent portion and the isolation layer, the isolation layer being away from the side surface of the dent so as to leave space for the bump electrode between the isolation layer and the side surface of the dent.

* * * * *